United States Patent
Ikehashi et al.

(10) Patent No.: US 6,320,231 B1
(45) Date of Patent: Nov. 20, 2001

(54) SEMICONDUCTOR DEVICE FOR PROTECTING A SEMICONDUCTOR CHIP FROM DAMAGE DUE TO ELECTROSTATIC DISCHARGE

(75) Inventors: Tamio Ikehashi, Kamakura; Kenichi Imamiya, Tokyo, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/649,583

(22) Filed: Aug. 29, 2000

(30) Foreign Application Priority Data

Aug. 31, 1999 (JP) .................................................. 11-246576

(51) Int. Cl.$^7$ .................................................. H01L 23/62
(52) U.S. Cl. .......................... 257/355; 257/173; 257/546; 257/587
(58) Field of Search .................................. 257/173, 355, 257/546, 587

(56) References Cited

U.S. PATENT DOCUMENTS

| 4,692,781 | 9/1987 | Roundtree et al. ................ 257/360 |
| 5,451,799 | * 9/1995 | Kurimoto et al. ................ 257/174 |
| 5,742,083 | * 4/1998 | Lin ................................. 257/355 |
| 5,932,914 | 8/1999 | Horiguchi ........................ 257/355 |
| 6,046,480 | * 4/2000 | Matsumoto et al. .............. 257/355 |
| 6,057,579 | * 5/2000 | Hsu et al. ........................ 257/360 |

FOREIGN PATENT DOCUMENTS 8-288465 * 11/1996 (JP) .............................. H01L/27/06

OTHER PUBLICATIONS

James N. Never, et al., "Failure Analysis of Shallow Trench Isolated ESD Structures", EOS/ESD Symposium Proceedings, pp. 273–288, 1995, (No Month Given).

* cited by examiner

Primary Examiner—Allan R. Wilson
(74) Attorney, Agent, or Firm—Banner & Witcoff, Ltd.

(57) ABSTRACT

In a semiconductor device having a diffusion-layer structure wherein high-concentration impurities are diffused into a low-impurity-concentration diffusion layer, two or more arrays of high-concentration diffusion layers are formed in each of diffusion layers constituting a collector region, an emitter region and a base region. Contacts are connected to their respective diffusion layers. A breakdown occurs on the diffusion layers, and heat generated therefrom is transmitted to the contacts.

9 Claims, 5 Drawing Sheets

SEMICONDUCTOR DEVICE FOR PROTECTING A SEMICONDUCTOR CHIP FROM DAMAGE DUE TO ELECTROSTATIC DISCHARGE

CROSS-REFERENCE TO RELATED APPLICATIONS

This application is based upon and claims the benefit of priority from the prior Japanese Patent Application No. 11-246576, filed Aug. 31, 1999, the entire contents of which are incorporated herein by reference.

BACKGROUND OF THE INVENTION

The present invention relates to a semiconductor device for protecting a semiconductor chip from damage due to electrostatic discharge (ESD). More specifically, the invention relates to effective measures against ESD which is applied to a semiconductor chip having a diffusion-layer structure in which high-concentration impurities are diffused into a low-impurity-concentration diffusion layer.

Generally ESD occurs when a semiconductor chip is conveyed by man or machine. When ESD occurs, a voltage of several hundreds of volts to several thousands of volts is applied between two terminals of the chip for a very short time. To protect the semiconductor chip from damage due to the ESD, an ESD protecting element is provided in the chip.

FIGS. 1 to 3 each illustrate an example of the structure of a prior art ESD protecting element. In these figures, the same components are denoted by the same reference numerals. FIG. 1 shows an example of the use of a diode as the ESD protecting element. In FIG. 1, an input pad 100 is connected to an internal circuit (not shown) through an input buffer circuit 101. A diode 103 is connected between the input buffer 100 and a power supply terminal 102. A diode 104 is also connected between the input buffer 100 and a ground terminal 105. FIG. 2 shows an example of the use of diode-connected bipolar transistors 106 and 107 as the ESD protecting element, while FIG. 3 shows an example of the use of diode-connected MOS transistors 108 and 109 as the ESD protecting element.

The ESD protecting elements shown in FIGS. 1 to 3 perform the same operation, so that the operation will be described with reference to FIG. 1 only. The power supply terminal 102 and ground terminal 105 of a semiconductor chip are in a floating state during the conveyance of the chip because no power supply voltage is applied to the terminals 102 and 105. When a discharge occurs between the input pad 100 and power supply terminal 102, the potential of the input pad 100 becomes higher than that of the power supply terminal 102 or the potential of the power supply terminal 102 becomes higher than that of the input pad 100. If the potential of the input pad 100 is higher than that of the power supply terminal 102, a forward current flows through the diode 103. If the potential of the power supply terminal 102 is higher than that of the input pad 100, the diode 103 breaks down and a current flows from the power supply terminal 102 to the input pad 100.

Similarly, when a discharge occurs between the input pad 100 and the ground terminal 105, the diode 104 causes a forward current to flow or breaks down to protect an internal circuit in accordance with the relationship in potential between the input pad 100 and the ground terminal 105.

When the semiconductor chip normally operates, i.e., when the potential VPAD of the input pad 100 satisfies the following expression (i), the ESD protecting element (diode 103) between the input pad 100 and power supply terminal 102 turns off and so does the ESD protecting element (diode 104) between the input pad 100 and ground terminal 105. This does not exert an influence upon the operation of the semiconductor chip.

$$Vss \leq VPAD \leq Vcc \quad (i)$$

where Vcc is a power supply voltage and Vss is a ground voltage.

FIGS. 4A and 4B are plan and sectional views of ESD protecting elements each constituted of a bipolar transistor. FIGS. 5A and 5B are also plan and sectional views of ESD protecting elements constituted of a MOS transistor. In FIGS. 4A and 4B, a p-type well region 110a is formed in an n-type semiconductor substrate 110. A collector region (C) 111, an emitter region (E) 112, and a base region (B) 113, which are each constituted of an impurity diffusion layer, are formed in the well region 110a. These regions 111, 112 and 113 are separated from each other by an STI (shallow trench isolation) 114. A plurality of contacts 115, 116 and 117, which are made of aluminum and tungsten, are formed in their respective regions 111, 112 and 113.

Referring to FIGS. 5A and 5B, a p-type well region 120a is formed in an n-type semiconductor substrate 120. A MOS transistor is formed in the well region 120a. A drain region (D) 121 and a source region (S) 122, which are constituted of an n-type impurity diffusion layer, are formed in the well region 120a. A gate electrode (G) 123 is formed above a channel region located between the drain and source regions 121 and 122 with a gate insulation film interposed therebetween. A plurality of contacts 124 and 125 constituted of aluminum and tungsten are formed in each of the drain and source regions 121 and 122. A contact region 127 of a p-type diffusion layer, which is separated from the above MOS transistor by an STI 126, is formed in the well region 120a. A plurality of contacts 128 are formed in the contact region 127.

In the ESD protecting elements shown in FIGS. 4A, 4B, 5A and 5B, distance DS (corresponding to a current path of each diffusion layer) between each of sides (a boundary between the diffusion layer and the STI) of the diffusion layer constituting each of the collector region 111, emitter region 112, base region 113, drain region 121, source region 122, and contact region 127 and each of the contacts 115, 116, 117, 124, 125 and 128 is set as long as possible for the following two reasons:

(1) When ESD occurs, a breakdown is easy to occur on the sides of the diffusion layer. For example, as illustrated in FIG. 4B, a breakdown occurs on a boundary Z between the collector region 111 and STI 114 to generate heat. If the distance DS is short, the heat will be transmitted to the contacts 115 to 117 and cause damage thereto. To prevent this, the distance DS is lengthened.

(2) If the distance DS is short, a current flows nonuniformly between each of the contacts and each of the sides of the diffusion layer. In other words, a current flows through a path whose resistance is the lowest (in the shortest distance). The current is therefore concentrated on a portion of the diffusion layer with a short distance D, and this portion is damaged. If the distance DS is lengthened, a current flows most uniformly between each of the contacts and each of the sides of the diffusion layer to prevent the diffusion layer from being damaged.

The optimum distance DS varies from process to process. For example, the distance DS is about 3 μm to 4 μm in the 0.25 μm process. This value is about ten times as large as the minimum value (design rules) of the distance between the contacts and the diffusion layer which depends upon reasons of processing.

The above diffusion layer is one connected to an input pad. It is known that to lengthen the distance between each contact and each side of a diffusion layer connected to a power supply terminal does not contribute to an improvement of resistance of ESD protecting elements (C. Duvvury, R. Rountree, D. Baglee, A. Hyslop, L. White, "ESD Design Considerations for ULSI," EOS/ESD Symp. Proc., p45, 1985).

As semiconductor chips decrease in size, a diffusion layer tends to be thinned by the scaling law. At a contact portion between a contact and a diffusion layer which are formed of metal such as aluminum and tungsten, the linearity (ohmic) of contact resistance has to be secured and the contact resistance itself has to be lowered. For this reason, conventionally, ions of the same polarity as that of the diffusion layer are rediffused from the opening of a contact.

In a diffusion layer 131 of an N-channel MOS transistor as shown in FIG. 6, an n+ layer 133 whose impurity concentration is high is formed directly under a contact 132 so as to protrude from the diffusion layer 131. A breakdown therefore occurs in the n+ layer 133. In a semiconductor chip having such a diffusion layer, it is not effective to form an ESD protecting element having a long distance DS between each side of the diffusion layer and each contact thereof as shown in FIGS. 4A, 4B, 5A and 5B. The reason is as follows. A breakdown occurs directly under the contacts and heat generates therefrom, so that it is not significant to lengthen the distance DS. This is not limited to the N-channel MOS transistor but true of a P-channel MOS transistor and a bipolar transistor.

BRIEF SUMMARY OF THE INVENTION

The object of the present invention is to provide a semiconductor device having a diffusion-layer structure in which high-concentration impurities are diffused into a low-impurity-concentration diffusion layer to have an effect on electrostatic discharge (ESD).

A semiconductor device according to one aspect of the present invention, comprises a first diffusion layer of a first conductivity type formed in a surface area of a first semiconductor layer, a plurality of second diffusion layers of the first conductivity type formed in the first diffusion layer, the second diffusion layers having impurity concentration which is higher than that of the first diffusion layer, and a plurality of contacts connected to the second diffusion layers, respectively, the plurality of contacts being constituted of at least two arrays of contacts formed in a widthwise direction of the first diffusion layer, wherein a distance between each of contacts located on both sides of the first diffusion layer and each of the sides of the first diffusion layer is not more than twice as long as a distance between adjacent contacts.

According to the semiconductor device of the present invention, heat generated in which portion a breakdown occurs can be scattered and transmitted to the plurality of contacts. It is thus possible to prevent the heat from locally increasing in temperature.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.
(First Embodiment)

Figure 7A:
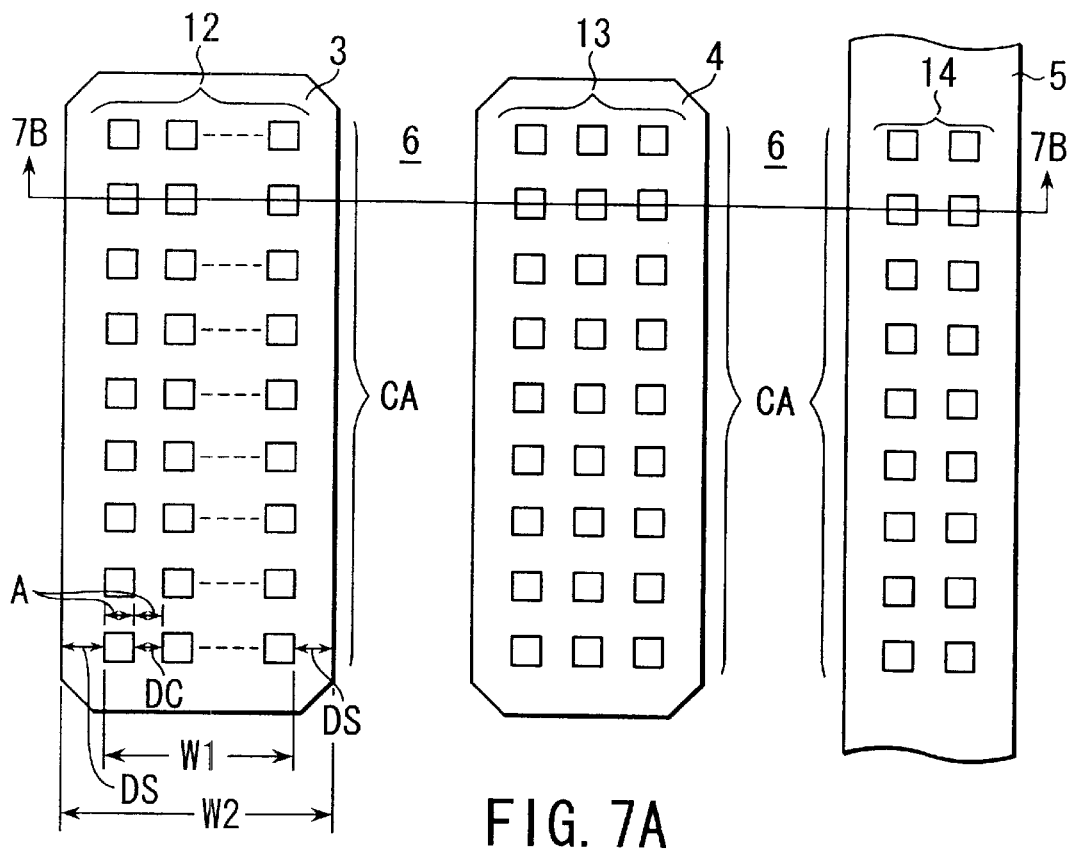
FIG. 7A is a schematic plan view exemplifying a bipolar transistor as a semiconductor chip according to a first embodiment of the present invention.
Figure 7B:
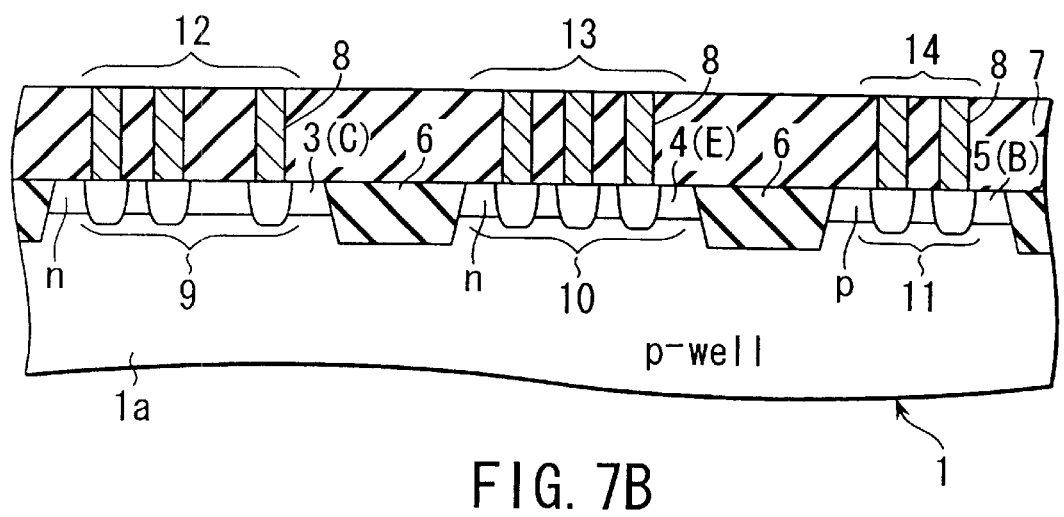
FIG. 7B is a schematic cross-sectional view taken along line 7B—7B of FIG. 7A.

FIGS. 7A and 7B illustrate a first embodiment of the present invention which is applied to a bipolar transistor. As these figures illustrate, a p-type well region (first semiconductor layer) 1a is formed in an n-type semiconductor substrate (first semiconductor layer) 1. A collector region (C) 3 and an emitter region (E) 4 both constituted of n-type impurities (e.g., phosphorus), and a base region (B) 5 constituted of p-type impurities (e.g., boron) are each almost like a rectangle as an impurity diffusion layer (a first diffusion layer of a first conductivity type). These regions 3, 4 and 5 are separated from each other by an STI (shallow trench isolation) 6. An insulation film 7 is formed on the substrate 1. A plurality of openings 8 are formed in the insulation film 7 so as to correspond to the regions 3, 4 and 5. High-concentration diffusion layers (a plurality of second diffusion layers of a second conductivity type) 9, 10 and 11 are formed in the surface region of the substrate 1 so as to correspond to their respective openings 8. These layers 9, 10 and 11 are formed in the following fashion. N-type impurities, such as arsenic, whose impurity concentration is higher than that of the regions 3, 4 and 5, are ion-implanted into these regions 3, 4 and 5 through the openings 8. The implanted impurities are then diffused by annealing. As a result, a plurality of high-concentration diffusion layers 9, 10 and 11 are formed in the collector, emitter and base regions 3, 4 and 5, respectively, so as to protrude from the undersides of the regions 3, 4 and 5. The concentration of impurities for forming the diffusion layers of the regions 3, 4 and 5 is, for example, $1\times10^{20}$ cm$^{-3}$ as a peak value, while the concentration of impurities for forming the high-concentration diffusion layers 9, 10 and 11 is, for example, $1\times10^{21}$ cm$^{-3}$ as a peak value. The impurities for forming the layers 9, 10 and 11 are not limited to arsenic, but any impurities can be used if they have a concentration capable of setting a condition on which a breakdown occurs.

The openings 8 include a plurality of contacts 12, 13 and 14 formed of aluminum, tungsten or the like and connected to the high-concentration diffusion layers 9, 10 and 11, respectively. The contacts 12, 13 and 14 are arranged as a plurality of contact arrays CA which are parallel with the collector, emitter and base regions 3, 4 and 5 in their longitudinal directions. The number of contact arrays CA is two or more in each of the regions 3, 4 and 5. The collector region 3 is connected to an input pad such as an external connection pad. The emitter and base regions 4 and 5 are connected to a power supply terminal or a ground terminal.

The arrangement of the foregoing contacts 12, 13 and 14 will be described further. It is thought that a semiconductor chip is damaged when electrostatic discharge (ESD) occurs if the highest temperature of heat generated on the diffusion layers at the time of a breakdown reaches the melting temperature of silicon. It is thus necessary that the highest temperature of heat locally generated should not reach the melting temperature of silicon. As described above, the largest amount of heat is generated from the diffusion layers connected to the input pad when a breakdown occurs. In the present embodiment, therefore, the largest amount of heat is generated from the collector region 3. It is thus necessary to form three or more contact arrays CA in the collector region 3 to prevent the highest temperature of locally-generated heat from reaching the melting temperature of silicon.

The distance DS between each of the contacts 12 located on both sides of the collector region 3 and each of the sides of the region 3 is greater than 0 μm and not more than twice as long as the distance DC between adjacent contacts 12. Preferably it is not less than 0.5 times and not more than 2 times as long as the distance DC. Specifically, the distance DS is a distance from an end portion of a current path of each diffusion layer to the contact 12 formed adjacent to the end portion. Therefore, the distance DS in the collector region 3 is as shown in FIG. 7A. It is desirable to shorten the distance DS in order to reduce the area of the diffusion layers. Considering a margin for mask alignment to form the opening 8, however, it is preferable that the distance DS be not less than 0.5 times and not more than 2 times as long as the distance DC between adjacent contacts 12, 13 and 14.

From another viewpoint, the foregoing distance DS is defined as follows. In a semiconductor memory device, transistors constituting ESD protecting elements constitute a peripheral circuit of the semiconductor memory device. In the ESD protecting elements of the present invention, the distance DS between each side of a diffusion layer of the transistor and each contact thereof is defined as not more than twice as long as the minimum of design rules. More specifically, when the distance DC is 0.3 μm, the distance DS is set to 0.35 μm (<0.3×2 μm).

The distance DS can also be defined by the ratio of width W1 of a forming region extending from one side of the contact array CA to the other side thereof to width W2 of the diffusion layer. When the number of contact arrays CA is two, if the width of each contact is 0.3 μm, the distance DC between adjacent contacts is 0.3 μm, and the distance DS is 0.35 μm, the ratio of W1 to W2 is given by the following equation:

$$W1/W2 = ((0.3\times2)+0.3)/((0.35+0.35)+((0.3\times2)+0.3))$$

$$= 0.9/1.6$$

$$\approx 0.56$$

Thus, the ratio of W1 to W2 is approximately 0.56.

If the number of contact arrays is three on the same conditions as the above, the ratio is given by the following equation:

$$W1/W2 = ((0.3\times3)+(0.3\times2))/((0.35+0.35)+$$

$$((0.3\times3)+(0.3\times2))$$

$$= 1.5/2.2$$

$$\approx 0.68$$

Thus, the ratio of W1 to W2 is approximately 0.68.

The ratio of W1 to W2 will now be described more specifically.

If, as illustrated in FIG. 7A, the width of each contact and the distance between adjacent contacts are each A and the number of contact arrays is k (an integer not less than 2), the widths W1 and W2 are expressed as follows:

$$W1 = A\times k + (k-1)\times A = 2Ak - A = A(2k-1)$$

$$W2 = W1 + 2DS = A(2k-1) + 2DS$$

When the ratio of W1 to W2 is X, the following equation is given:

$$X = W1/W2 = \{A(2k-1)\}/\{A(2k-1)+2DS\}$$

The distance DS between each of both sides of the diffusion layer and each of the contacts thereof is obtained from the above equation as follows:

$$DS = \{A(2k-1) - XA(2k-1)\}/2X = A(2k-1)(1-X)/2X \quad (1)$$

[1] If, as described above, the distance DS is not more than twice as long as the width A of the contact, i.e., $0 < DS \leq 2A$, then the following expression is obtained from the above equation (1):

$$0 < A(2k-1)(1-X)/2X \leq 2A$$

By modifying the expression, the following is given:

$$0 < A(2k-1)(1-X) \leq 4XA$$

Thus, the following two expressions are obtained:

$$0 < A(2k-1)(1-X) \quad (2)$$

$$A(2k-1)(1-X) \leq 4XA \quad (3)$$

Since, in the expression (2), A>0 and 2k−1>0, X is given by:

$$X < 1 \quad (4)$$

From the expression (3), X is obtained as follows:

$$A(2k-1)(1-X) \leq 4XA \quad (5)$$
$$(2k-1) - (2k-1)X \leq 4X$$
$$2k-1 \leq 4X + (2k-1)X$$
$$(2k-1)/(2k+3) \leq X$$

From the above expressions (4) and (5), the following expression (6) is obtained:

$$(2k-1)/(2k+3) \leq X < 1 \quad (6)$$

When k=2 in the expression (6), X has the following ranges:

$$3/7 \leq X < 1$$
$$0.43 \leq X < 1 \quad (7)$$

These ranges include $X \approx 0.56$ described above. When k=3, X has the following ranges:

$$5/9 \leq X < 1$$
$$0.56 \leq X < 1 \quad (8)$$

These ranges include $X \approx 0.68$ described above.

[2] If the distance DS is not less than ½ times and not more than two times as long as the width A of the contact, i.e., $A/2 \leq DS \leq 2A$, considering a margin for mask alignment, then the following expression is obtained from the above equation (1):

$$A/2 \leq A(2k-1)(1-X)/2X \leq 2A$$

Thus, the following two expressions are obtained:

$$AX \leq A(2k-1)(1-X) \quad (9)$$
$$A(2k-1)(1-X) \leq 4XA \quad (10)$$

If A is deleted from the expression (9), the following is obtained:

$$X \leq (2k-1)(1-X)$$

X is thus given as $$X \leq (2k-1)/2k \quad (11)$$

If A is deleted from the expression (10), the following is obtained:

$$(2k-1)(1-X) \leq 4X$$

X is thus given as $$(2k-1)/(2k+3) \leq X \quad (12)$$

From the above expressions (11) and (12), the following expression (13) is obtained:

$$(2k-1)/(2k+3) \leq X \leq (2k-1)/2k \quad (13)$$

When k=2 in the expression (6), X has the following ranges:

$$3/7 \leq X \leq 3/4$$
$$0.43 \leq X \leq 0.75 \quad (14)$$

These ranges include $X \approx 0.56$ described above.

When k=3, X has the following ranges:

$$5/9 \leq X \leq 5/6$$
$$0.56 \leq X \leq 0.83 \quad (15)$$

These ranges include $X \approx 0.68$ described above.

Even when the distance DS is defined by the ratio $X(=W1/W2)$, it is better to extend the range of the ratio, as indicated by the above expression (6), in order to reduce the area of the diffusion layers. Considering a margin for mask alignment to form the above opening 8, it is desirable to cause the ratio to fall within the range shown in the above expression (13).

If the relationship in arrangement among the contacts (the conditions of arrangement of the contacts) is applied to the emitter and base regions 4 and 5 as well as the collector region 3, the ESD protecting elements can be improved in performance further.

According to the first embodiment described above, the high-concentration diffusion layers 9, 10 and 11 are each formed on the entire surface of a diffusion layer constituting each of the collector, emitter and base regions 3, 4 and 5. The contacts 12, 13 and 14 are connected to the diffusion layers 9, 10 and 11, respectively. A breakdown occurs on each of the diffusion layers 9, 10 and 11, and heat is generated therefrom and transmitted to each of the contacts 12, 13 and 14. It is thus possible to prevent the temperature from locally increasing and prevent the internal circuit from being damaged due to ESD.

Since the breakdown occurs on the high-concentration diffusion layers 9, 10 and 11, a current path between each of the contacts of the diffusion layer and each of the sides thereof need not be taken into consideration unlike in the prior art. The distance DS can be shortened and the area of transistors constituting the ESD protecting elements can be decreased.

The contacts 12, 13 and 14, each of which includes two or more arrays, are provided on their respective diffusion layers serving as the collector, emitter and base regions 3, 4 and 5 in accordance with the heating value.

Figure 1:
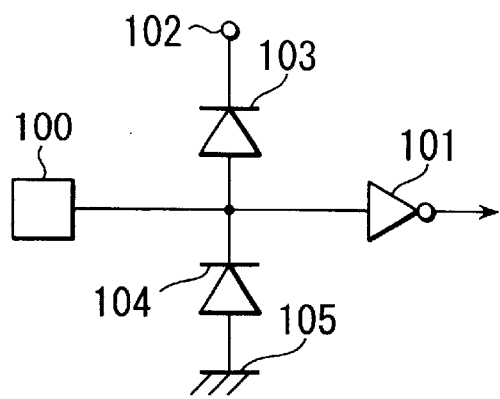
FIG. 1 is a circuit diagram showing an example of ESD protecting elements in order to describe prior art of the present invention and its problems.
Figure 2:
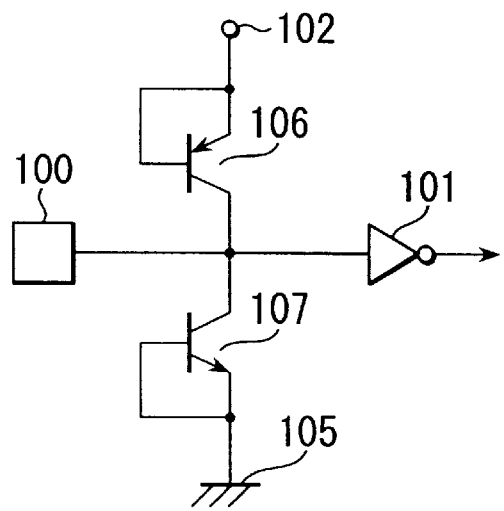
FIG. 2 is a circuit diagram showing another example of prior art ESD protecting elements.
Figure 3:
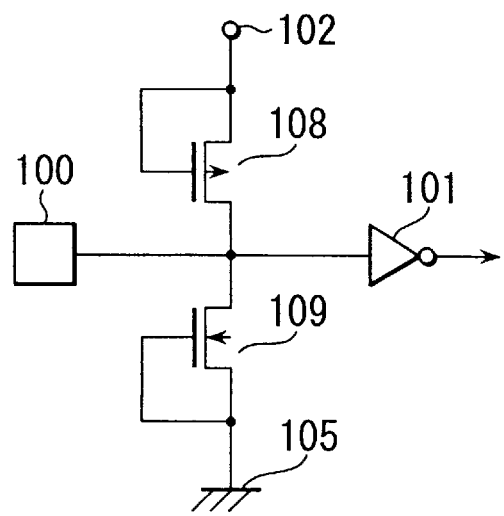
FIG. 3 is a circuit diagram showing still another example of prior art ESD protecting elements.
Figure 4A:
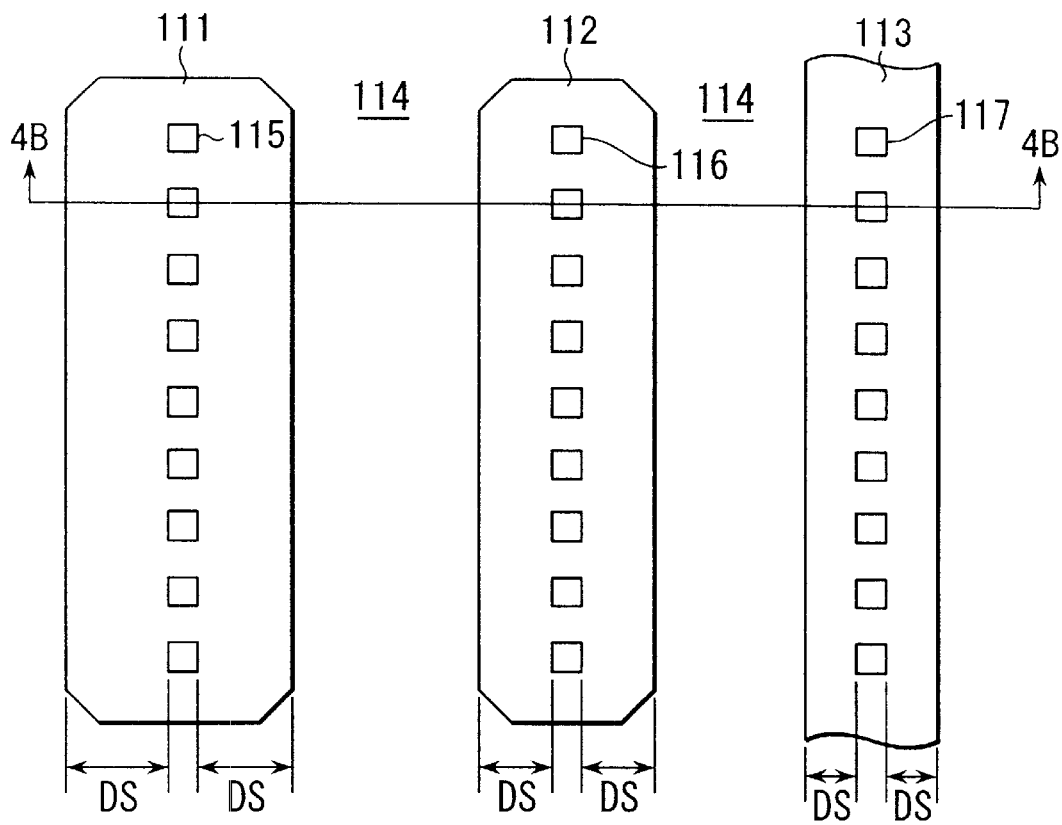
FIG. 4A is a plan view showing an example of the arrangement of prior art ESD protecting elements.
Figure 4B:
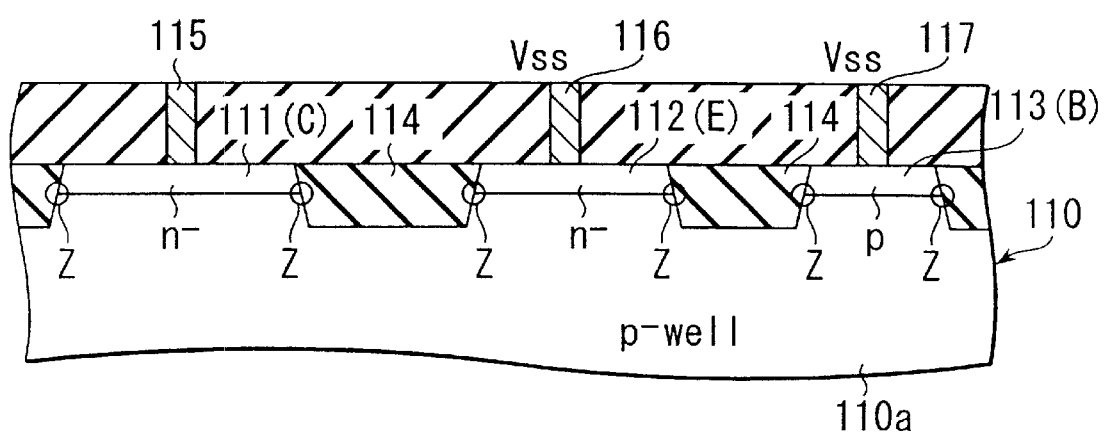
FIG. 4B is a cross-sectional view taken along line 4B—4B of FIG. 4A.
Figure 5A:
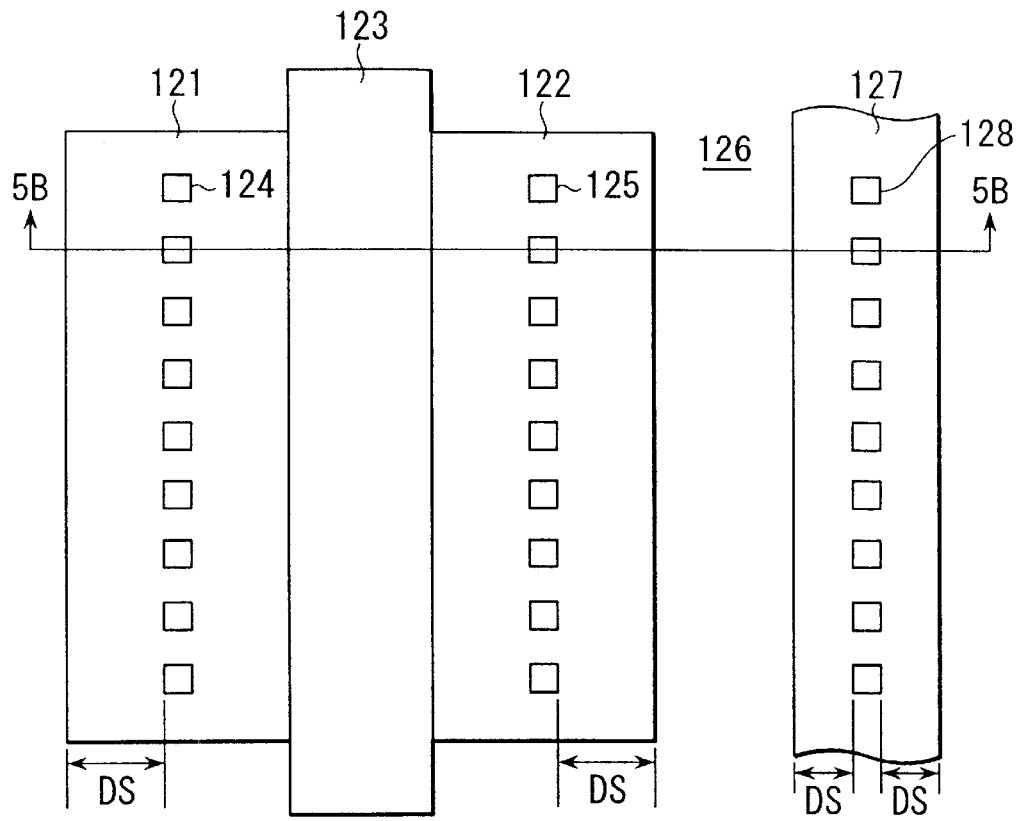
FIG. 5A is a plan view showing another example of the arrangement of prior art ESD protecting elements.
Figure 5B:
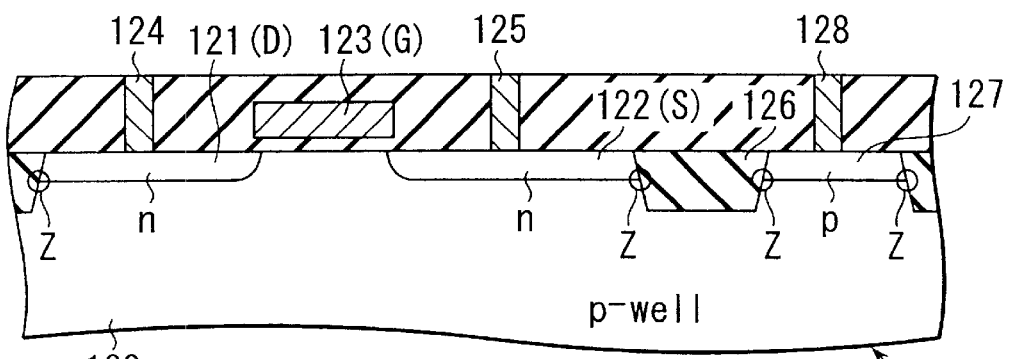
FIG. 5B is a cross-sectional view taken along line 5B—5B of FIG. 5A.
Figure 6:
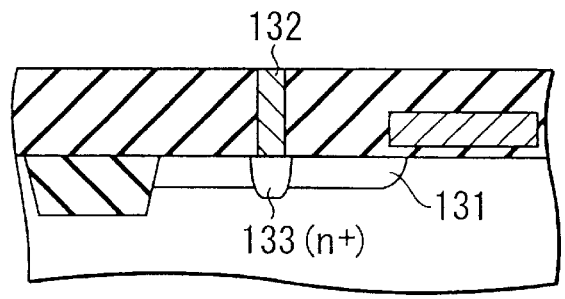
FIG. 6 is a cross-sectional view showing still another example of the arrangement of prior art ESD protecting elements.

In particular, three or more arrays of contacts 12 are provided in a region where a breakdown will occur with a high probability and a large amount of heat will be generated when electrostatic discharge occurs, such as the collector region 3. By doing so, the heating regions can be scattered and so can be the amounts of heat, and the highest temperature can be lowered. In other words, the amount of heat generated when electrostatic discharge occurs depends upon both the discharge voltage and the capacitance added to the external connection pad. When the amount of heat is considered to be the same as that of the prior art shown in FIGS. 4A and 4B, if the number of contact arrays CA is one as in the prior art, the heat scattered on either side of the diffusion layer (Z in FIG. 4B) concentrates directly under the contact arrays CA. Therefore, the heat cannot be radiated sufficiently from the contacts. In contrast, when the number of contact arrays CA is two, the amount of heat generated directly under each of the contact arrays CA is half the amount of heat generated when the number of contact arrays CA is one. Almost all the heat can thus be emitted from the two arrays of contacts CA. Moreover, when the number of contact arrays CA is three or more, the amount of heat generated from each of the contact arrays CA is reduced to one third or less, so that heat can be radiated from the contact arrays CA with reliability.

The distance DS between each of the contacts 12 located on both sides of the collector region 3 and each of the sides of the region 3 is set not more than twice as long as the distance DC between adjacent contacts 12. The contacts 12 can thus be formed closer to the sides of each diffusion layer, as compared with the prior art. Thus, even when the contacts 12 are increased in number, the area of diffusion layers can be prevented from increasing and so can be the layout area thereof on a semiconductor chip.

The contacts 12 are each formed of metal having good thermal conductivity, such as aluminum and tungsten. Therefore, the contacts have the advantage that they can quickly radiate heat which is generated due to the increase of the contacts 12.

Figure 8A:
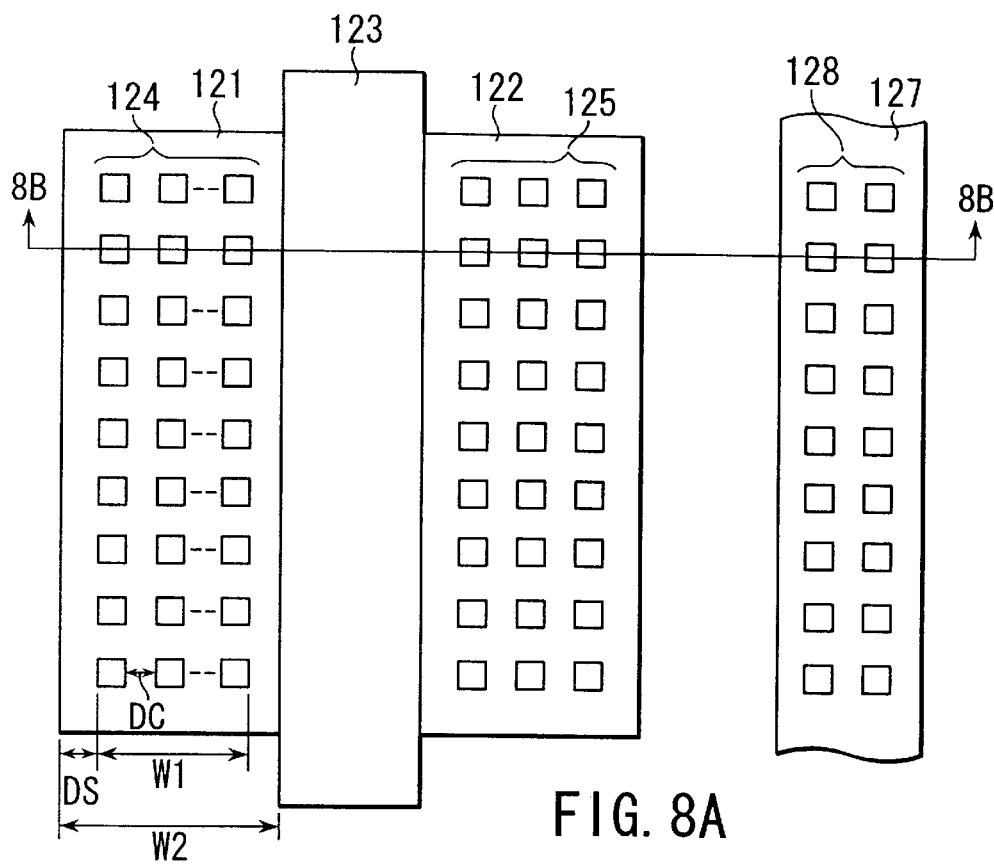
FIG. 8A is a schematic plan view exemplifying a MOS transistor as a semiconductor chip according to the present invention.
Figure 8B:
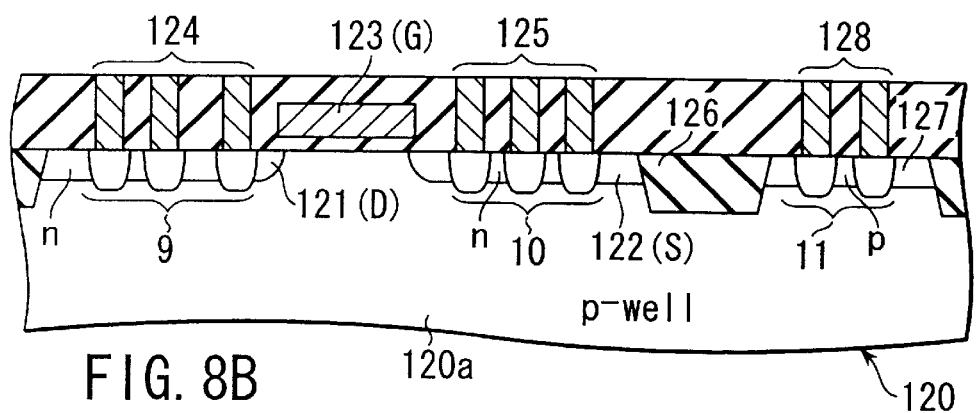
FIG. 8B is a schematic cross-sectional view taken along line 8B—8B of FIG. 8A.

According to the above first embodiment, the present invention is applied to a bipolar transistor. The present invention is not limited to it but can be applied to ESD protecting elements serving as a diode and those serving as a MOS transistor. In the case of the MOS transistor in particular, as shown in FIGS. 8A and 8B, three or more arrays of contacts 124 are formed on a drain region 121 connected to an input pad.

Moreover, according to the first embodiment, the ESD protecting elements are connected to the input buffer. The present invention is not limited to this. For example, an output buffer can be used to function as a MOS type ESD protecting element. If, in this case, the above-described structure is applied to a diffusion layer of a MOS transistor constituting the output buffer, the same advantage as that of the first embodiment can be produced.

(Second Embodiment)

Figure 9:
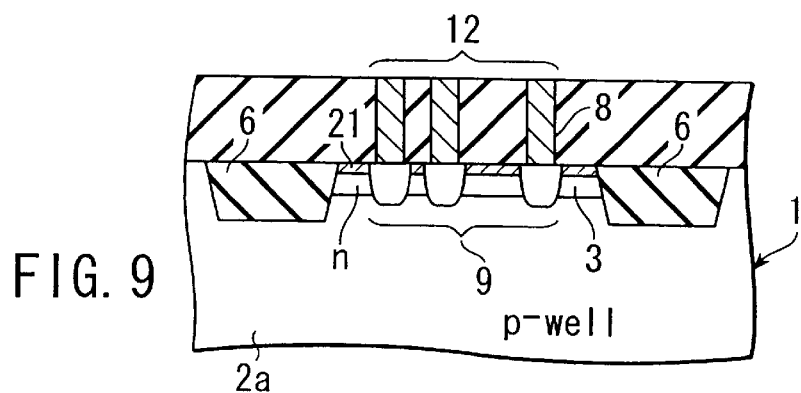
FIG. 9 is a cross-sectional view illustrating the main part of a semiconductor chip having a silicide diffusion layer according to a second embodiment of the present invention.

FIG. 9 shows an example of the structure of a semiconductor device according to a second embodiment of the present invention. In FIG. 9, the same constituting elements as those in FIGS. 7A and 7B are denoted by the same reference numerals and their descriptions are omitted. In the first embodiment, the contacts are formed in a diffusion layer whose impurity concentration is high. It can be thought to form a diffusion layer having such a high impurity concentration as to cause a breakdown in a region where contacts are to be formed intentionally. It is particularly effective to apply such a structure to a semiconductor chip having a silicide diffusion layer which makes it difficult to secure a high resistance to ESD.

In the structure shown in FIG. 9, a silicide layer (a silicide diffusion layer) 21, which is constituted of tungsten, is formed in a surface area of an n-type diffusion layer (a first diffusion layer of a first conductivity type) 3. High-concentration n-type impurities are introduced through a plurality of openings 8 to form high-concentration diffusion layers (a plurality of second diffusion layers of a second conductivity type) 9 in the silicide layer 21 and diffusion layer 3. A plurality of contacts 12 are formed in correspondence to the high-concentration diffusion layers 9. The relationship in arrangement between the diffusion layer 3 and contacts 12 in the second embodiment is the same as that in the first embodiment. In other words, two or more, preferably three or more arrays of contacts 12 are formed in the diffusion layer 3 which radiates a large amount of heat. Furthermore, the relationship between the distance DC between adjacent contacts 12 and the distance DS between each of contacts 12 located on both sides of the diffusion layer 3 and each of the sides of the layer 3 is the same as that in the first embodiment.

According to the second embodiment, the plurality of contacts 12 are connected to the high-concentration diffusion layers 9 formed in the silicide layer 21 and diffusion layer 3. Thus, a high ESD-resistance can be secured for a semiconductor chip having a silicide diffusion layer.

According to the present invention described in detail above, there can be provided a semiconductor device having a diffusion-layer structure in which high-concentration impurities are diffused into a low-impurity-concentration diffusion layer to have an effect on electrostatic discharge.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first diffusion layer of a first conductivity type formed in a surface area of a first semiconductor layer;
   a plurality of second diffusion layers of the first conductivity type formed in the first diffusion layer, the second diffusion layers having impurity concentration which is higher than that of the first diffusion layer; and
   a plurality of contacts connected to the second diffusion layers, respectively, the plurality of contacts being constituted of at least two arrays of contacts formed in a widthwise direction of the first diffusion layer,
   wherein a distance between each of contacts located on both sides of the first diffusion layer and each of the sides of the first diffusion layer is not more than twice as long as a distance between adjacent contacts.

2. The semiconductor device according to claim 1, wherein when the number of arrays of contacts formed in the widthwise direction of the first diffusion layer is k (k is an integer not less than 2), a width of a contact forming region in the widthwise direction of the first diffusion layer is W1, a width of the first diffusion layer is W2, and a ratio of the width W1 to the width W2 is X, a following expression is satisfied:

$(2k-1)/(2k+3) \leq X < 1$.

3. The semiconductor device according to claim 1, wherein when the number of arrays of contacts formed in the widthwise direction of the first diffusion layer is k (k is an integer not less than 2), a width of a contact forming region in the widthwise direction of the first diffusion layer is W1, a width of the first diffusion layer is W2, and a ratio of the width W1 to the width W2 is X, a following expression is satisfied:

$(2k-1)/(2k+3) \leq X \leq (2k-1)/2k$.

4. The semiconductor device according to claim 1, wherein the plurality of second diffusion layers are protruded from a bottom of the first diffusion layer.

5. The semiconductor device according to claim 1, wherein a silicide diffusion layer is formed in a surface area of the first diffusion layer.

6. The semiconductor device according to claim 1, wherein the first diffusion layer is a collector region of a bipolar transistor separated by shallow trench isolation.

7. The semiconductor device according to claim 6, wherein the plurality of contacts include three or more arrays of contacts in a widthwise direction of the collector region.

8. The semiconductor device according to claim 1, wherein the first diffusion layer is a drain region of a MOS transistor.

9. The semiconductor device according to claim 1, wherein the first diffusion layer is an anode electrode of a diode.

* * * * *